US008822289B2

(12) United States Patent
Fang et al.

(10) Patent No.: US 8,822,289 B2
(45) Date of Patent: Sep. 2, 2014

(54) HIGH VOLTAGE GATE FORMATION

(71) Applicant: Spansion LLC, Sunnyvale, CA (US)

(72) Inventors: Shenqing Fang, Fremont, CA (US); Chun Chen, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 70 days.

(21) Appl. No.: 13/715,739

(22) Filed: Dec. 14, 2012

(65) Prior Publication Data

US 2014/0167137 A1 Jun. 19, 2014

(51) Int. Cl.
*H01L 29/792* (2006.01)
*H01L 27/115* (2006.01)

(52) U.S. Cl.
CPC ....... *H01L 27/11563* (2013.01); *H01L 27/1157* (2013.01); *H01L 27/11573* (2013.01)
USPC .......... 438/267; 438/275; 438/264; 438/258; 438/257; 257/316; 257/321; 257/324; 257/326; 257/E27.103

(58) Field of Classification Search
CPC ............... H01L 27/11563; H01L 27/10894; H01L 27/11573; H01L 27/11568; H01L 27/1157; H01L 27/11531; H01L 27/11534; H01L 27/11536; H01L 27/11539; H01L 27/11541; H01L 27/11543; H01L 27/11546
See application file for complete search history.

(56) References Cited

U.S. PATENT DOCUMENTS

| | | | |
|---|---|---|---|
| 5,824,584 A | 10/1998 | Chen et al. | |
| 5,969,383 A | 10/1999 | Chang et al. | |
| 6,174,759 B1 | 1/2001 | Verhaar et al. | |
| 6,972,997 B2 | 12/2005 | Ishimaru et al. | |
| 7,057,230 B2 | 6/2006 | Tanaka et al. | |
| 7,115,943 B2 | 10/2006 | Mine et al. | |
| 7,371,631 B2 | 5/2008 | Sakai et al. | |
| 7,414,283 B2 | 8/2008 | Tanaka et al. | |
| 7,504,689 B2 | 3/2009 | Hisamoto et al. | |
| 7,557,005 B2 | 7/2009 | Ishii et al. | |
| 7,663,176 B2 | 2/2010 | Sakai et al. | |
| 7,667,259 B2 | 2/2010 | Yasui et al. | |
| 7,700,992 B2 | 4/2010 | Tanaka et al. | |
| 7,723,779 B2 | 5/2010 | Hisamoto et al. | |
| 7,863,135 B2 | 1/2011 | Sakai et al. | |
| 7,863,670 B2 | 1/2011 | Ishii et al. | |

(Continued)

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

(Continued)

*Primary Examiner* — Julio J Maldonado
*Assistant Examiner* — Molly Reida
(74) *Attorney, Agent, or Firm* — Sterne, Kessler, Goldstein & Fox P.L.L.C.

(57) ABSTRACT

Embodiments described herein generally relate to methods of manufacturing charge-trapping memory by patterning the high voltage gates before other gates are formed. One advantage of such an approach is that a thin poly layer may be used to form memory and low voltage gates while protecting high voltage gates from implant penetration. One approach to accomplishing this is to dispose the layer of poly, and then dispose a mask and a thick resist to pattern the high voltage gates. In this manner, the high voltage gates are formed before either the low voltage gates or the memory cells.

10 Claims, 13 Drawing Sheets

(56) References Cited

U.S. PATENT DOCUMENTS

| | | | |
|---|---|---|---|
| 8,017,986 B2 | 9/2011 | Tanaka et al. | |
| 8,125,012 B2 | 2/2012 | Mine et al. | |
| 2003/0211691 A1* | 11/2003 | Ueda | 438/258 |
| 2005/0176202 A1* | 8/2005 | Hisamoto et al. | 438/257 |
| 2006/0261398 A1 | 11/2006 | Lee | |
| 2007/0221960 A1* | 9/2007 | Ashida | 257/213 |
| 2008/0029805 A1* | 2/2008 | Shimamoto et al. | 257/315 |
| 2008/0048249 A1* | 2/2008 | Tega et al. | 257/326 |
| 2008/0185635 A1* | 8/2008 | Yanagi et al. | 257/325 |
| 2009/0256193 A1 | 10/2009 | Ishii et al. | |
| 2010/0032741 A1* | 2/2010 | Ueno | 257/298 |
| 2010/0200909 A1* | 8/2010 | Kawashima et al. | 257/326 |
| 2011/0211396 A1 | 9/2011 | Takeuchi | |
| 2012/0018794 A1 | 1/2012 | Lu et al. | |

OTHER PUBLICATIONS

Matsubara, K., et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., Hitachi, "A 512kB MONOS type Flash Memory Module Embedded in a Microcontroller," 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008

Yanagi, I., et al., "Quantum confinement effect of efficient hole injection in MONOS-type nonvolatile memory—the role of ultrathin i-Si/P$^+$ poly-Si stacked gate structure fabricated by laser spike annealing," 146-147, Symposium on VLSI Technology, Digest of Technical Papers, Central Research Laboratory, Hitachi Ltd., 2007.

International Search Report and Written Opinion of the International Searching Authority for International Application No. PCT/US2013/074651, mailed Apr. 15, 2014.

\* cited by examiner

HIGH VOLTAGE GATE FORMATION

BACKGROUND

Technical Field

The embodiments described herein generally relate to non-volatile memory, such as charge trapping memory.

A non-volatile memory, such as Flash memory, retains stored data even if power to the memory is removed. A non-volatile memory cell stores data, for example, by storing electrical charge in an electrically isolated floating gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power applications.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

It is common to monolithically incorporate multiple types of field-effect devices on the same substrate as memory cells. Those non-memory devices perform, for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters. Accordingly, there is a need for device and methods for integrating a memory cell and other devices on the same substrate to facilitate improved cost, performance, reliability, or manufacturability.

BRIEF SUMMARY

It is desirable to obviate or mitigate at least one of the problems, whether identified herein or elsewhere, or to provide an alternative to existing apparatuses or methods. Embodiments described herein include methods, systems and devices for forming high voltage gates in a computer memory.

In an embodiment, a method of manufacturing a semiconductor device that includes a memory region, a first substrate region, and a second substrate region. A first gate is formed in the first substrate region. A select gate is formed in the memory region. A charge trapping dielectric is disposed in the memory region and the second substrate region. A polycrystalline silicon (poly) layer is disposed in the memory region. The charge trapping dielectric is removed from the second substrate region. A memory gate is formed on a sidewall of the select gate. A second gate is formed in the second substrate region. In this method, the memory gate is formed before the second gate is formed.

In an embodiment, a semiconductor device includes a memory region, a first substrate region, and a second substrate region. There are first gates in the first substrate region. There are second gates in the second substrate region. There are select gates in the memory region. There are memory gates in the memory region, with each memory gate formed adjacent to a corresponding select gate. In the embodiment, sidewalls of the memory gates are older than (i.e., formed before) sidewalls of the second gates.

These and other advantages and features will become readily apparent in view of the following detailed description of embodiments of the invention. Note that the Summary and Abstract sections may set forth one or more, but not all exemplary embodiments of the present invention as contemplated by the inventor(s). It is to be appreciated that the Detailed Description section, and not the Summary and Abstract sections, is intended to be used to interpret the claims.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
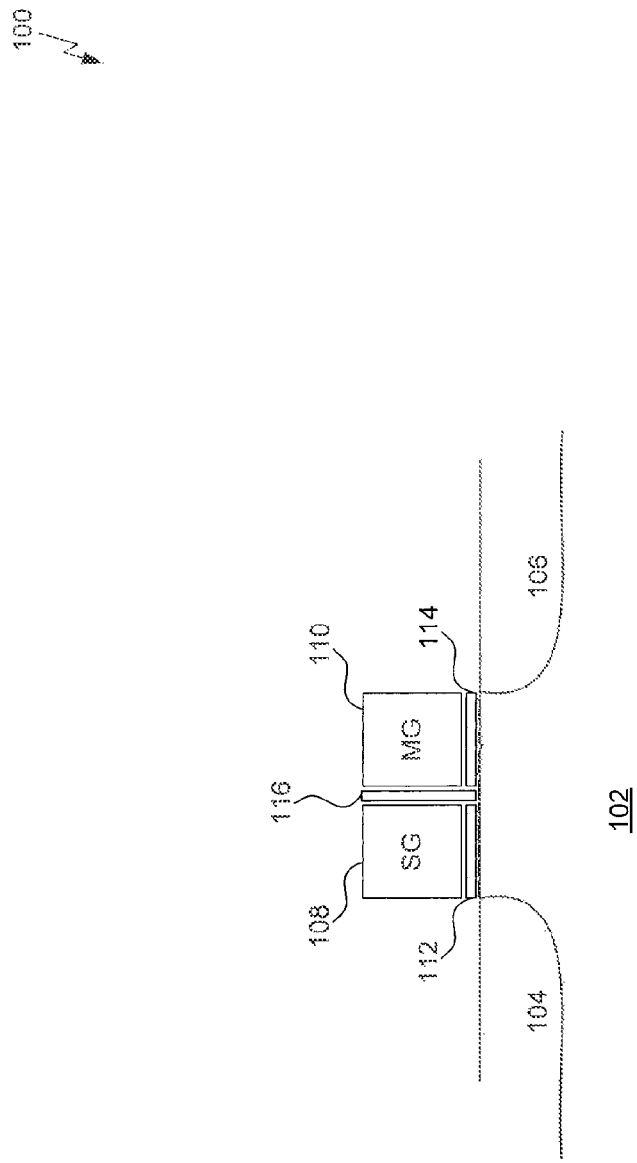
FIG. 1 illustrates an example of a split-gate non-volatile memory cell, according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structur-

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. However, "removing" is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist or the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc.

The term "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

The term "poly" as used throughout the descriptions is most commonly thought to be polycrystalline silicon. Poly comprises multiple small crystals, as opposed to being a single monocrystal. Poly can be doped, or may have metal or a metal silicide deposited over it.

"Poly" in this application is used as one example of a gate conductor. Other conductors may be used to form the gates, for example metals, alloys other doped semiconductors or conducting materials as would become apparent to a person having ordinary skill in the art. The use of "poly" in the description of the embodiments is not to be limiting.

FIG. 1 illustrates an example of a split-gate non-volatile memory cell 100 according to an embodiment. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped poly layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a silicon nitride layer sandwiched between two silicon dioxide layers to create a three-layer stack collectively and commonly referred to as "ONO". Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. After the gates have been defined, regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within Memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and 3 volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
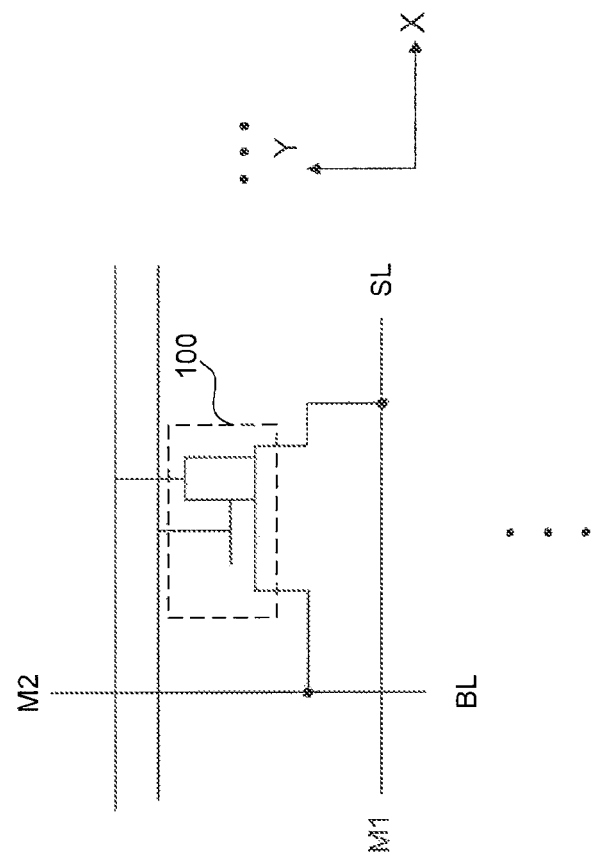
FIG. 2 illustrates an example circuit diagram of memory cell including connections to various metal layers in a semiconductor device, according to an embodiment.

FIG. 2 illustrates an example circuit diagram of memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
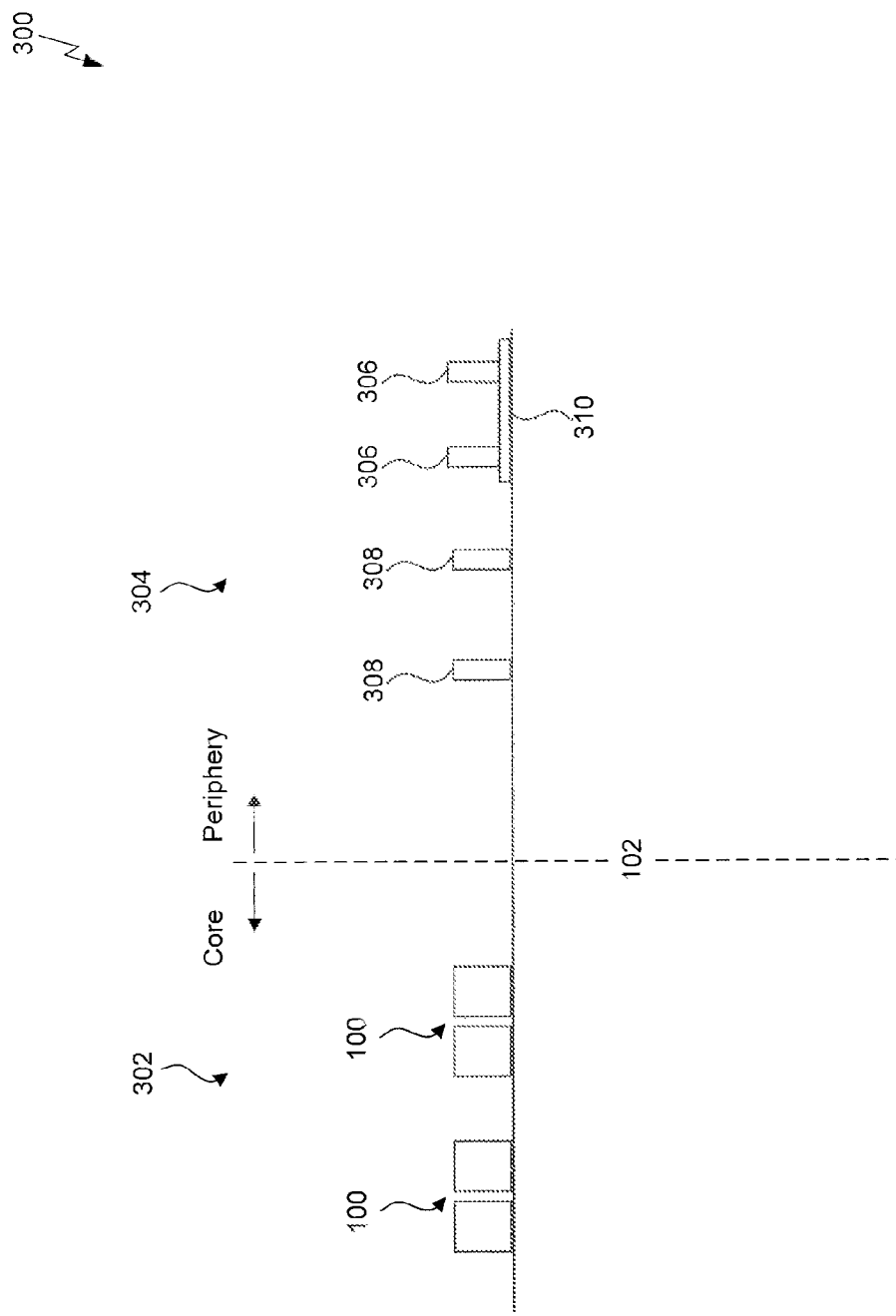
FIG. 3 illustrates an example semiconductor device that includes both memory and peripheral circuitry embedded in the same substrate, according to an embodiment.

FIG. 3 illustrates an example semiconductor device that includes both memory and peripheral circuitry in the same substrate. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308.

With charge trapping memory, there is a desire to manufacture low voltage transistors 308 and memory cells 100 from a thin poly layer because the thin layer allows for improved performance. However, given that semiconductor device manufacturing generally occurs as a series of steps involving disposing layers, it would be impractical to manufacture the high voltage transistors 306 from a different layer of poly than the low voltage transistors 308, thus constraining the high voltage transistors 306 to have the same thickness as the low voltage transistors 308. Where thinness improves the performance of a low voltage transistor 308, thinness can leave high voltage transistors 306 susceptible to implant penetration. One way to enjoy the benefits of a thin poly in both low voltage transistors 308 and memory cells 100, while not damaging high voltage transistors 306 by implant penetration is to form the high voltage transistors 306 before forming the low voltage transistors 308 and memory cells 100.

FIGS. 4-13 collectively illustrate a method of fabrication for a semiconductor device including memory cells and other FET devices, according to an embodiment. It should be understood that the various layers and structures are not necessarily drawn to scale, and that other processing steps may be performed between those steps illustrated and described herein, as would be understood by one skilled in the art given the present disclosure.

Figure 4:
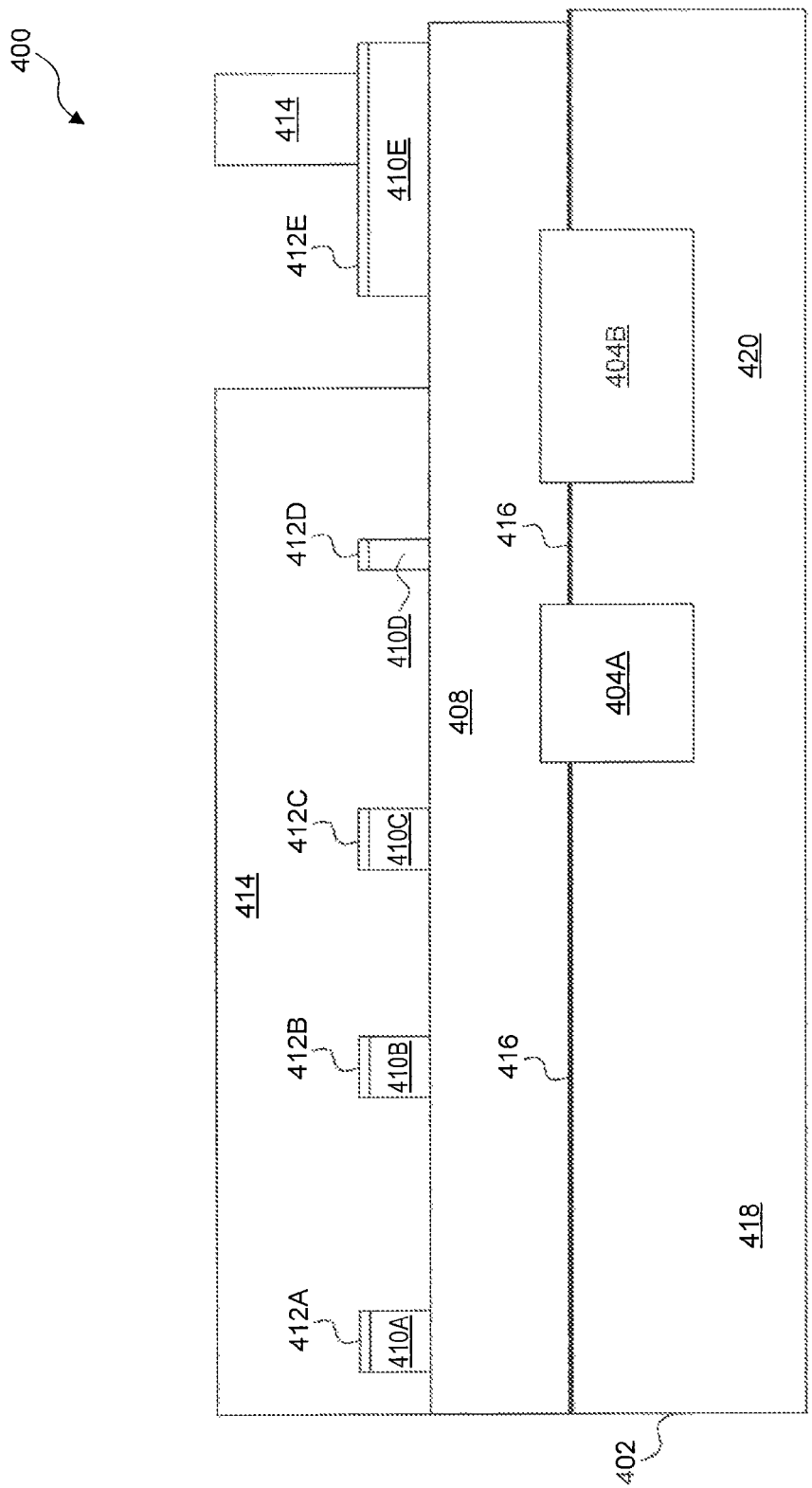
FIGS. 4-13 illustrate a semiconductor device in various stages of manufacturing, according to an embodiment.

FIG. 4 illustrates a step in the method of fabrication of an intermediate semiconductor device 400. Many steps are required to create the structures on the substrate 402, such as disposing layers, masking, stripping, and the like, as would be apparent to a person having ordinary skill in the art.

The semiconductor device 400 of FIG. 4 has a substrate 402 comprising silicon, or the like, and shallow trench isolations 404 formed therein. The method of fabrication disposes a gate oxide dielectric 416 in the memory region and the second substrate region, and a thicker gate dielectric in the first substrate region. In certain embodiments, the method can form semiconductor devices that are not strictly logic in the first and second substrate regions 418 and 420 as discussed below.

The method forms a first poly layer 408 on the substrate 402. The method patterns five instances of a hard mask 410 on the first poly layer 408. The method forms a nitride layer 412 on each instance of an oxide hard mask 410. The top layer comprises a photoresist mask 414.

The region to the left of the leftmost shallow trench isolation 404A corresponds to a core (area or region) 418. The core 418 is an example of a memory region. The portion of substrate 402 depicted to the right of core 418 is a periphery (area or region) 420. Within the periphery 420, the region between the two shallow trench isolations 404A and 404B corresponds to a region of the semiconductor device 400 that may be suitable for forming low voltage logic. The remaining area of the substrate 402 may be suitable for forming high voltage logic. The semiconductor device 400 is an example of disposing a mask and a thick resist on a first substrate region.

Figure 5:
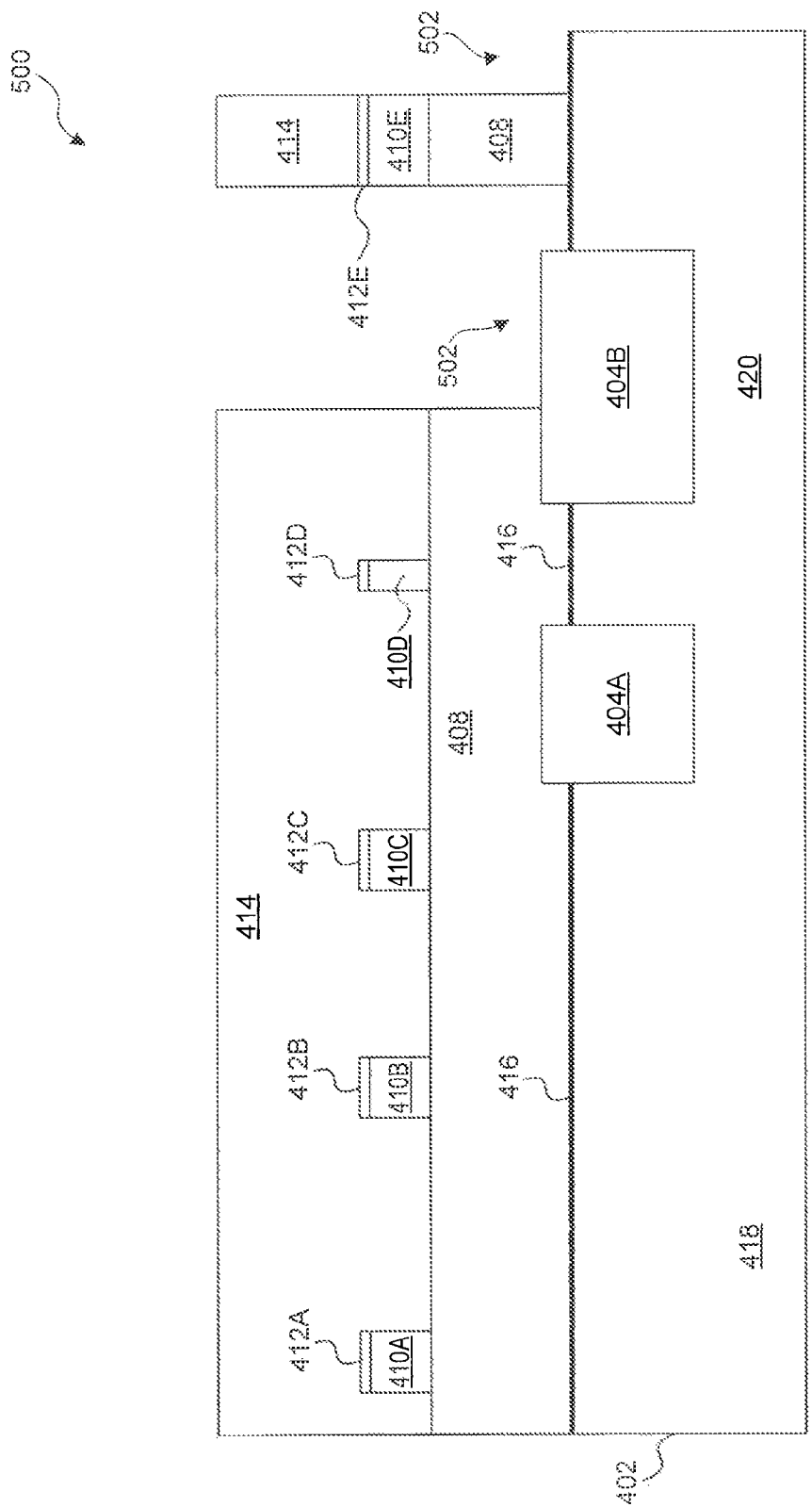

FIG. 5 illustrates a later step in the method of fabrication to form an intermediate semiconductor device 500. The method commences by removing, by etching, for example, the portions of the semiconductor device 500 that are unprotected by the photoresist mask 414, as shown generally at locations 502.

Figure 6:
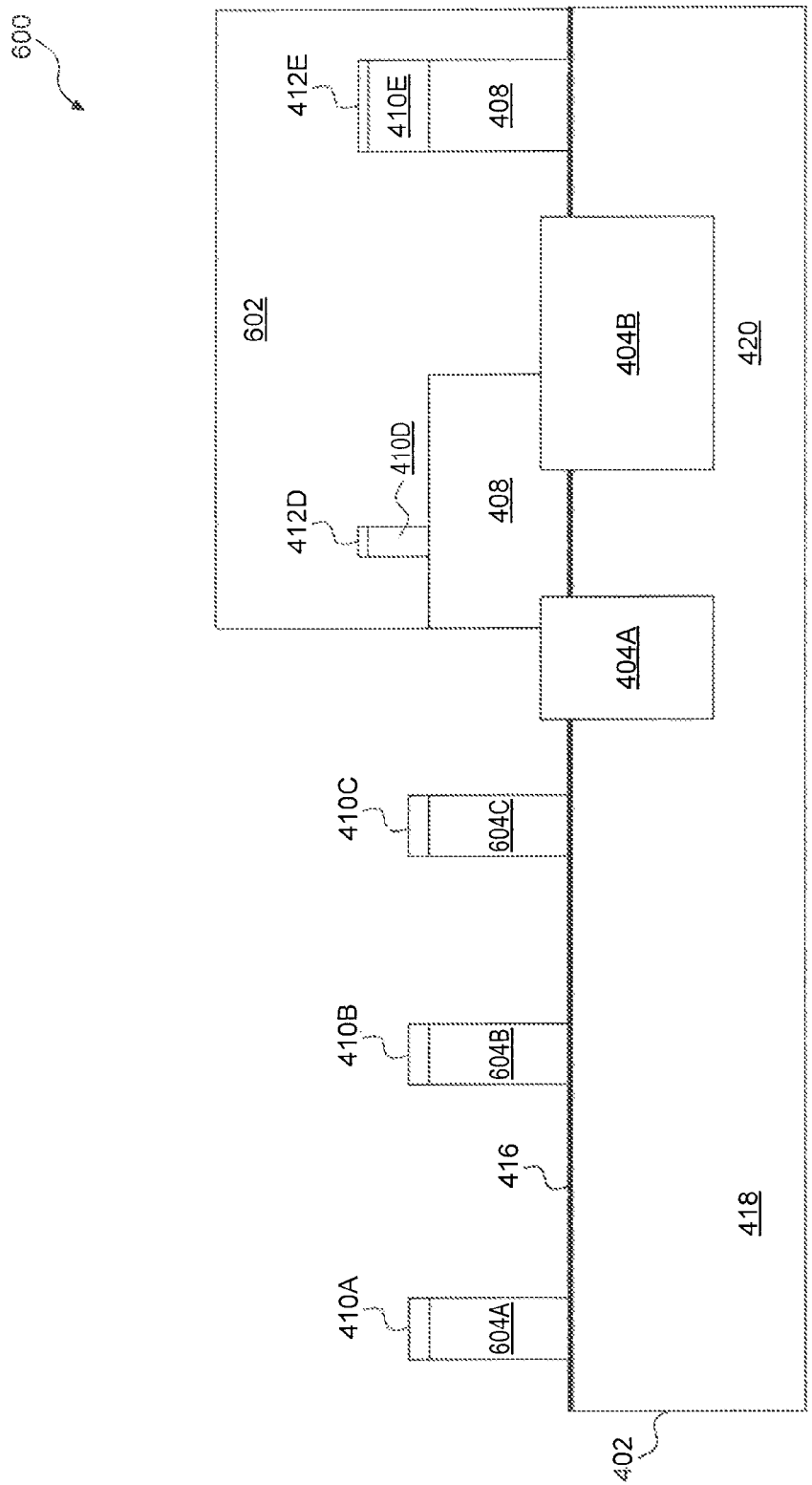

FIG. 6 illustrates a later step in the method of fabrication to form an intermediate semiconductor device 600. The method removes the photoresist mask 414 and etches the core 418. The method disposes a blocking mask 602 over the periphery 420 to protect the first layer of poly 408 in the periphery 420. The method removes the nitride layers 412 and a portion of the oxide hard mask 410 in the core 418 by etching the core 418. The hard masks 410 over the first poly layer 408 in the core 418 protect the first poly layer 408 from the etching, so as to form select gates 604. Each select gate 604 can be 90 nanometers (nm) wide, but can also be from 15 nm to 100 nm wide. Other widths can also be used.

Figure 7:
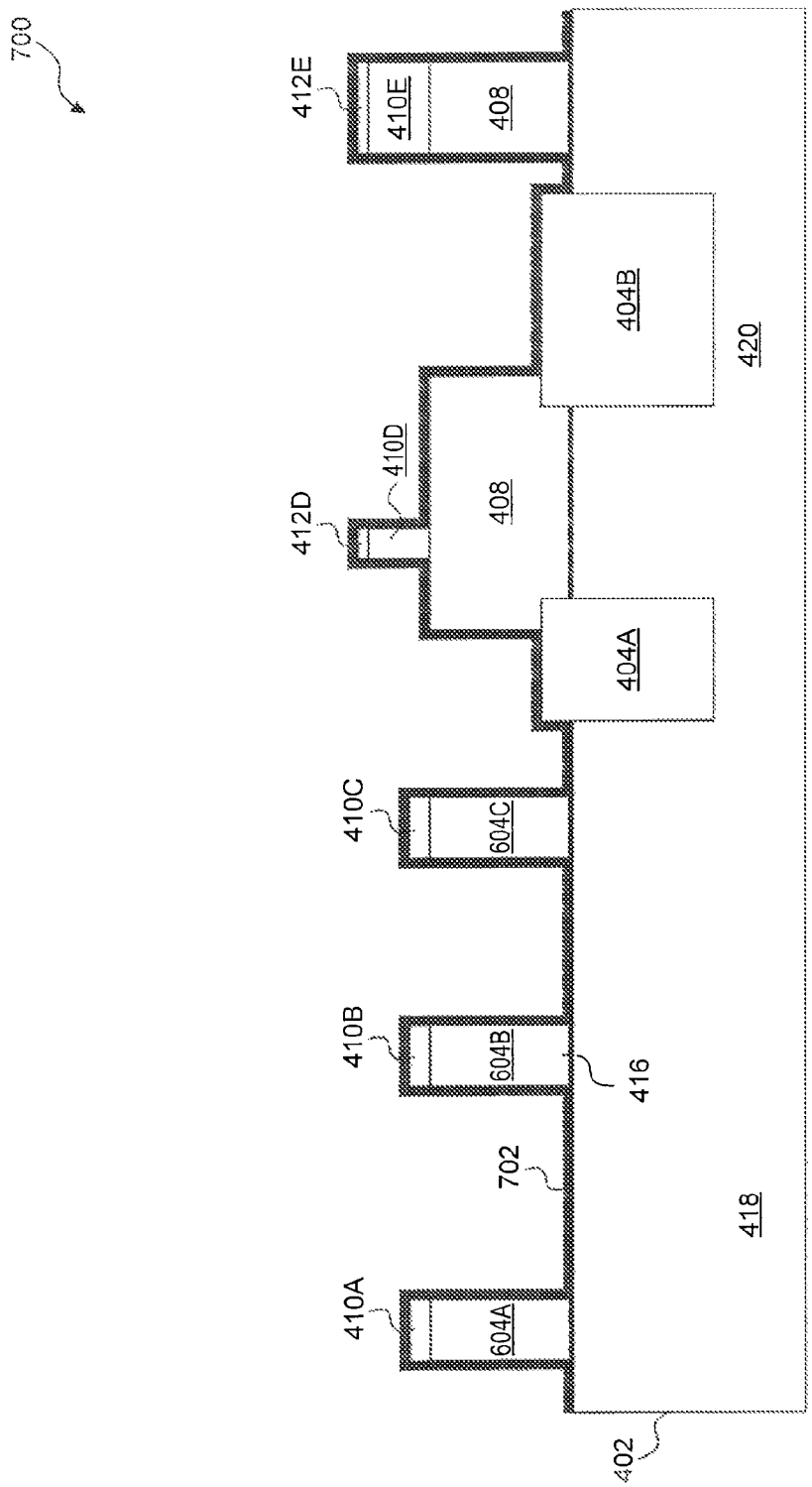

FIG. 7 illustrates a later step in the method of fabrication to form an intermediate semiconductor device 700. The method removes the periphery blocking mask 602. The method completely etches away the gate oxide dielectric 416, except for underneath the gates. The method disposes an ONO charge trapping dielectric 702 across the substrate 402. The ONO charge trapping dielectric 702 may comprise a 5 nm bottom oxide, a 12.5 nm SiN layer, and an 8 nm oxide layer on the SiN. Other variations and combinations of thicknesses can be employed.

Figure 8:
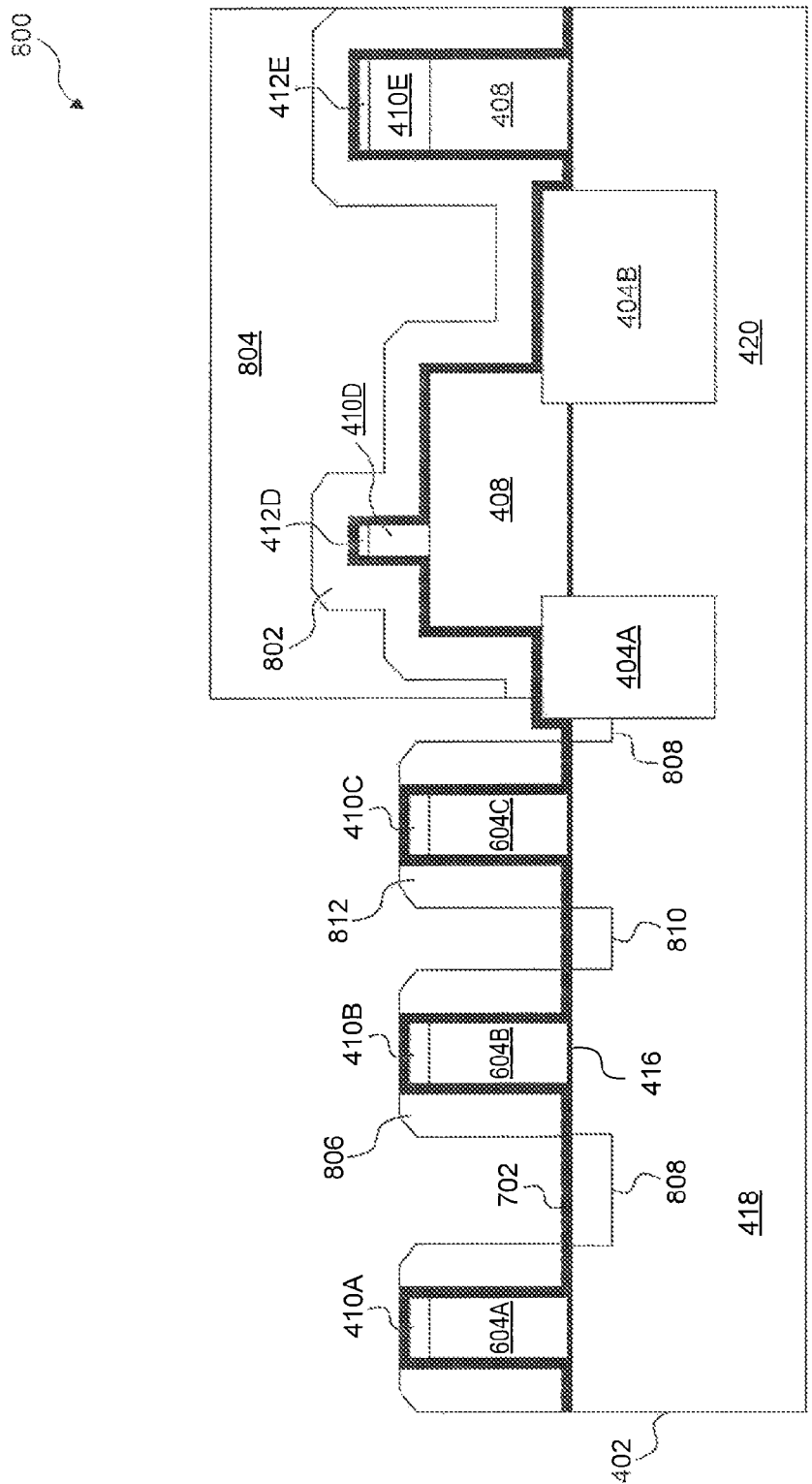

FIG. 8 illustrates a later step in the method of fabrication to form an intermediate semiconductor device 800. The method disposes a second poly layer 802 over the entire structure 800. The method disposes a second periphery blocking mask 804. The method masks the second poly layer 802 in the periphery 420 and removes from the core 418, thereby creating sidewalls 806. The method performs appropriate patterning and then an N+ implant to form source/drain regions 808/810, for example.

Figure 9:
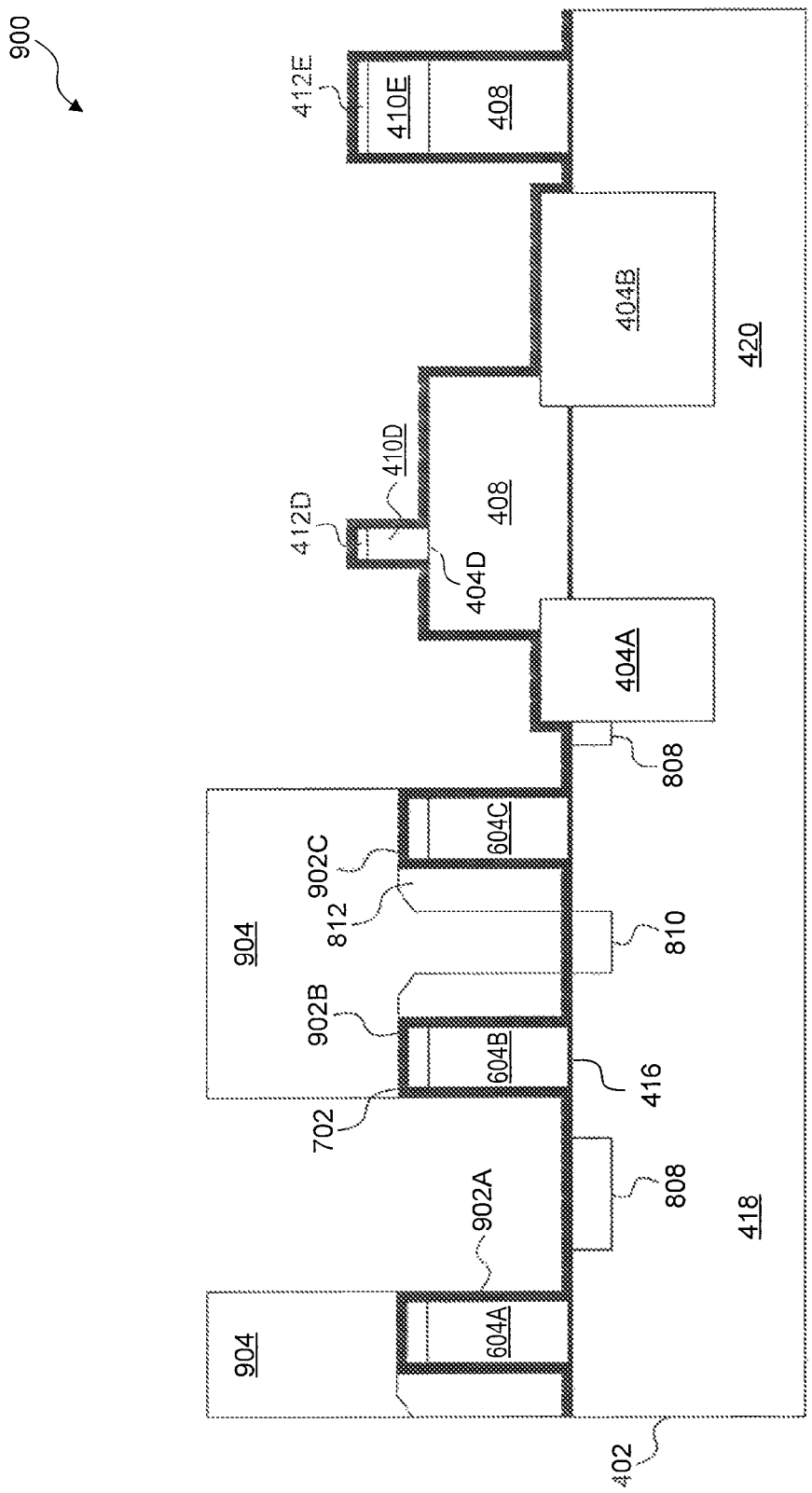

FIG. 9 illustrates a later step in the method of fabrication to form an intermediate semiconductor device 900. The method removes a periphery blocking mask 804 and forms a source blocking mask 904 so that portions of the second poly layer 802 can be removed by etching, for example, from both the core 418 and periphery 420. The method removes all of the second poly layer 802 in the periphery 420. The etching also removes select sidewalls 806 in the core 418. The remaining sidewalls 806 form memory gates 812. This etching is an example of removing a poly layer from a second sidewall of a select gate 604.

Figure 10:
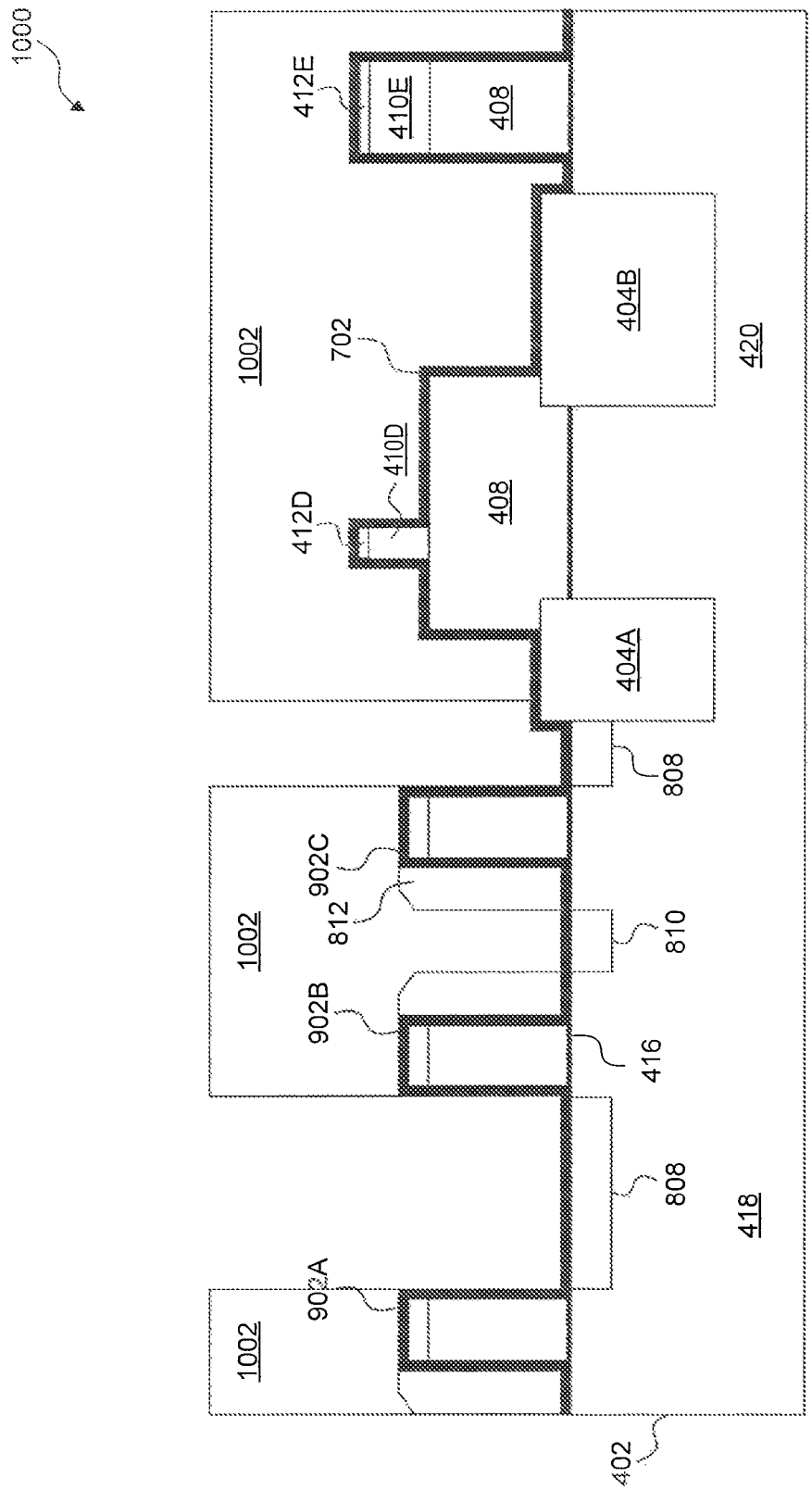

FIG. 10 illustrates a later step in the method of fabrication to form an intermediate semiconductor device 1000. The method disposes a select gate drain implant mask 1002. The source blocking mask 904 can be used as an element of select gate drain implant mask 1002. The method performs a second implanting to expand the drains 808 for the select gates 604. The second implanting covers the entire distance between consecutive select gates 604.

Figure 11:
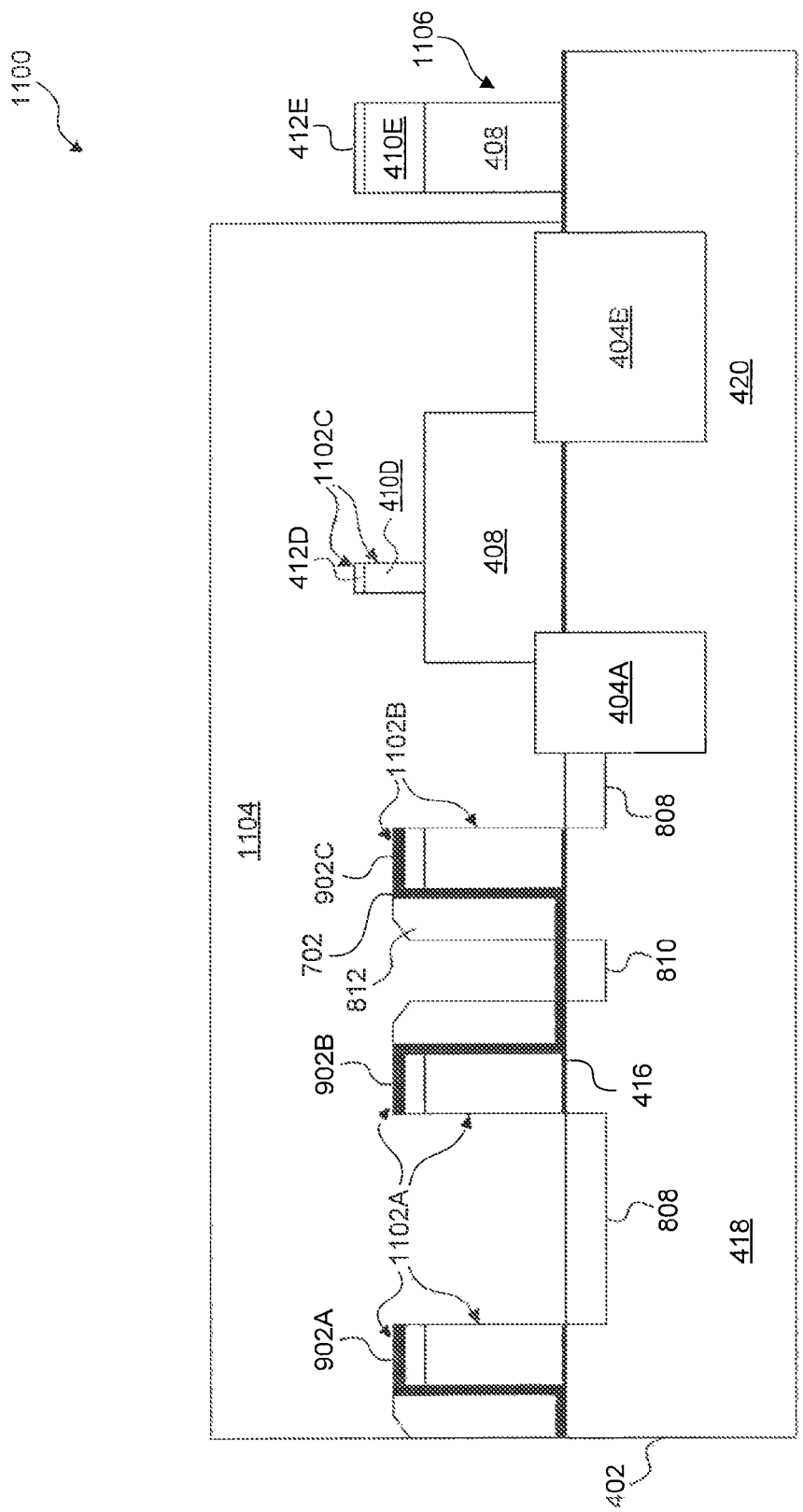

FIG. 11 illustrates a later step in the method of fabrication to form an intermediate semiconductor device 1100. The method removes the ONO charge trapping dielectric 702 by a wet etch across the memory region, the first gate region and the second gate region, except under the memory gates and on the memory sidewall between the memory gate and the select gate as indicated by arrows 1102. The method disposes a high voltage lightly doped drain mask 1104 over most of the substrate 402. The full hard mask stacks 412E and 410E on top of the poly 408 allow the lightly doped drains to be implanted without harming other elements of the semiconductor device 1100, specifically, to avoid penetrating the first poly 408. The hard mask 410E can be approximately 5 nm to 70 nm thick. The hardmask 412E can be 10 nm to 70 nm thick. The regions of the first poly 408 that are not masked (i.e., the first poly 408 that is suitable to become a high voltage transistor) is 90 nm thick. The semiconductor device 1100 is an example of a hard mask 410 being thinner than a first gate, as the first poly 408 can be formed into a high voltage transistor 1106.

Figure 12:
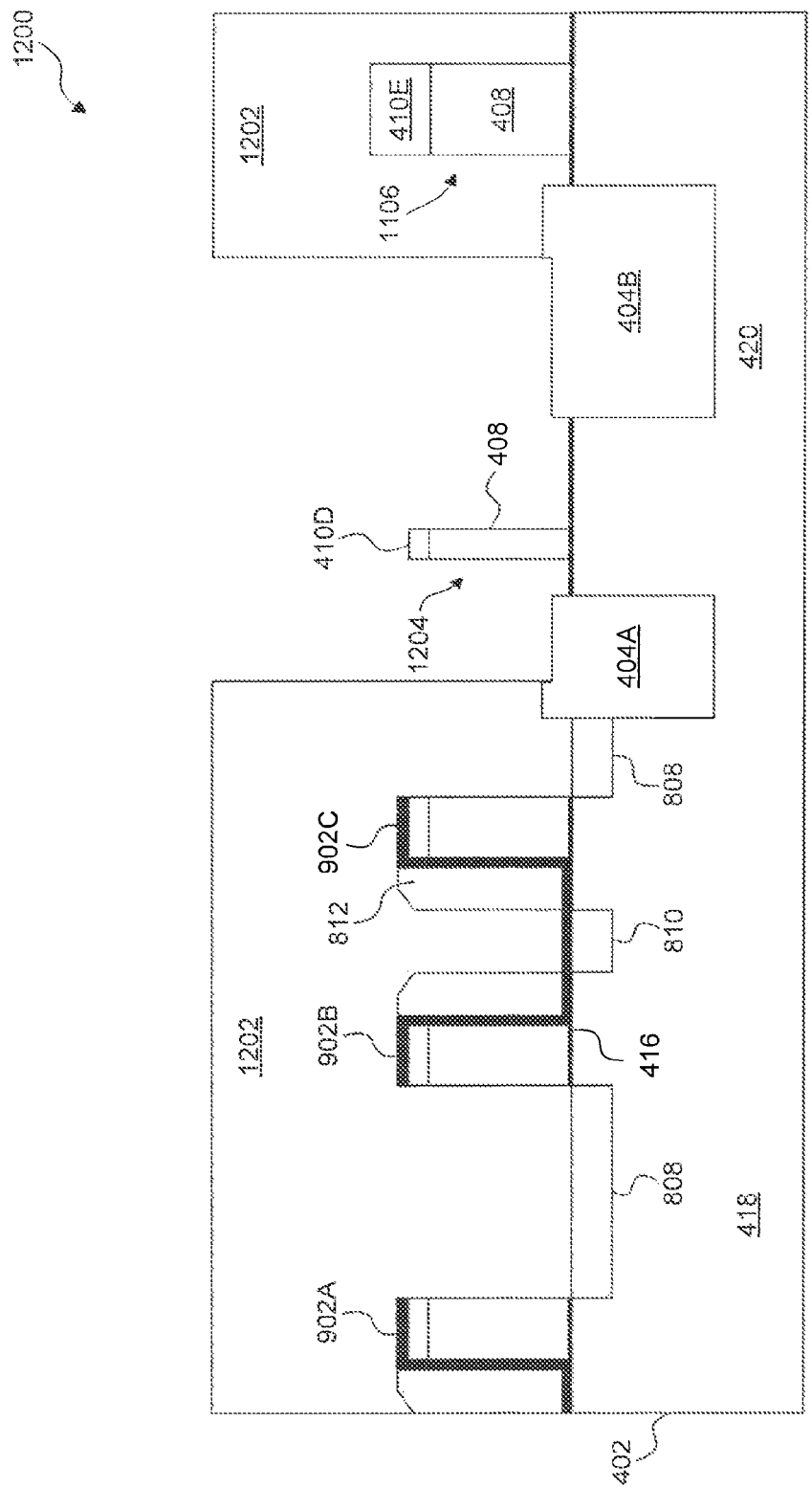

FIG. 12 illustrates a later step in the method of fabrication to form an intermediate semiconductor device 1200. The method disposes a gate poly etch mask 1202 to cover the core 418 and the high voltage region of the periphery 420. The method performs a 90 nm etch over the poly 408 in the low voltage region of the periphery 420. The etch removes the SiON layer 412D and a portion of the hard mask 410D. An over etching would create less than about 24 nm of gouging in the shallow trench isolations 404. The 90 nm etch simultaneously removes a portion of the low voltage region of the substrate 402 and the hard mask 410D. This etching patterns the low voltage transistor 1204. The area where low voltage transistor 1204 forms is an example of a second substrate region. The gate length of the low voltage transistor 1204 may be much shorter than the gate length of the high voltage transistor 1106 because the low voltage transistor 1204 can be designed to conduct a smaller amount of current. This processing is an example of forming a second gate, e.g., low voltage transistor 1204, after forming the memory gates 812.

Figure 13:
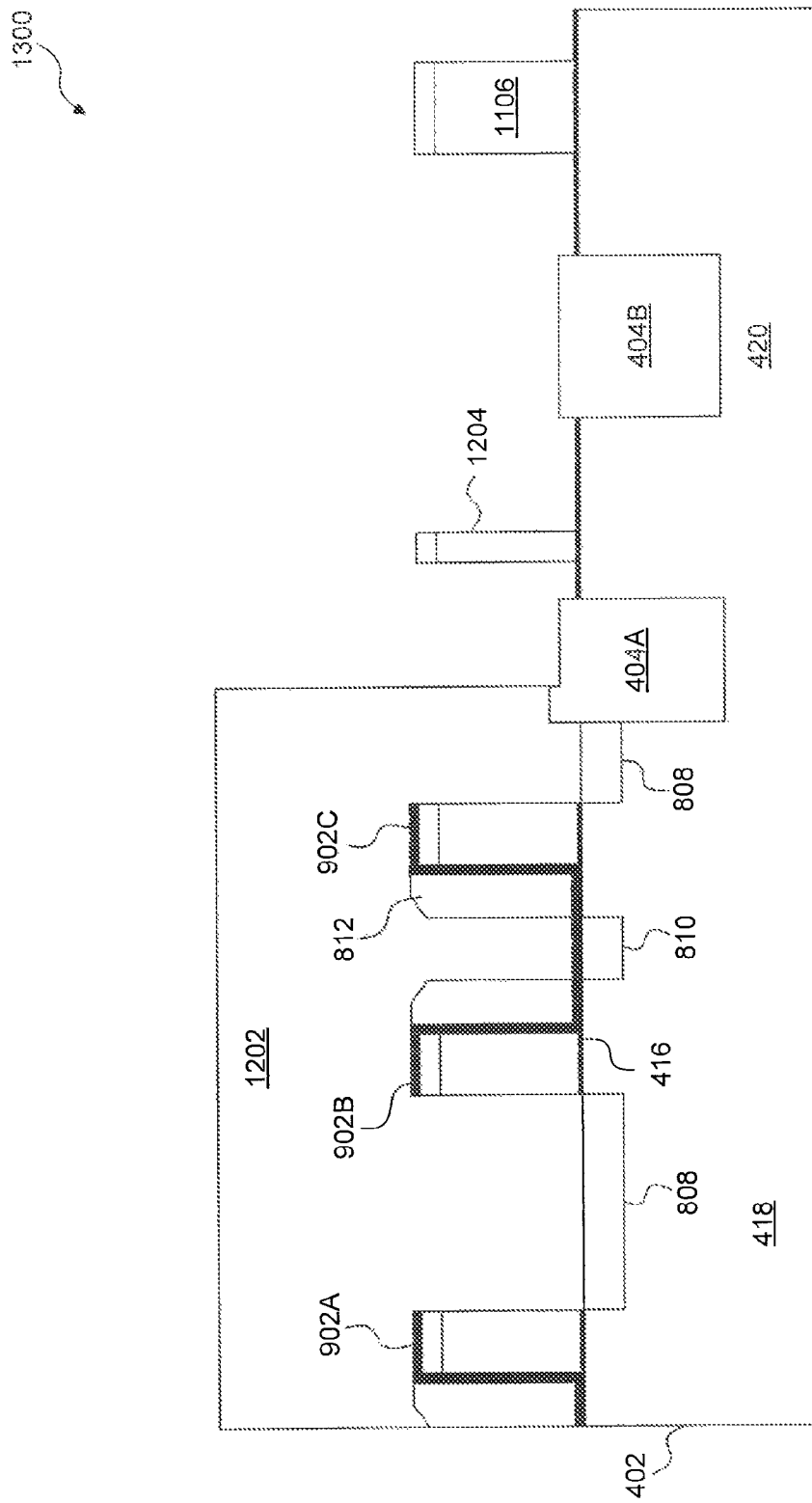

FIG. 13 illustrates a another embodiment to replace the steps in FIG. 12. The method of fabrication to forms an intermediate semiconductor device 1300. The method removes the gate poly etch mask 1202 in the periphery region 420. An etch patterns low voltage gate 1204, completely etches away hardmask 412D and 412E, and partially removes the 410D and 410E on 1204 and 1106 at the same time. The area where high voltage transistor 1106 forms is an example of a first substrate region. A high voltage transistor 1106 can be from about 0.1 microns wide to about 3 microns wide. In certain embodiments, a high voltage transistor 1106 can be wider than 3 microns. The high voltage transistor 1106 has the same thickness as the low voltage transistor 1204. The above described process allows the high voltage transistor 1106 to be patterned with the same thickness as the low voltage transistor 1204, while allowing them to have different gate widths.

Following the step of FIG. 13, traditional manufacturing steps may be performed. These steps can include, spacers, source and drain regions for the high voltage transistor 1106 and low voltage transistor 1204. Additional steps include, silicide, inter-metal dielectric layers, contacts, metals and the like.

A high voltage transistor 1106 in the high voltage substrate region is an example of a first logic transistor in the first substrate region. A low voltage transistor 1204 in the low voltage substrate region is an example of a second logic transistor in the second substrate region. One aspect of the semiconductor device 1300 of FIG. 13 is that the high voltage transistor 1106 has the same thickness as the low voltage transistor 1204. This shared thickness can be between 40 nm and 100 nm.

Though FIGS. 4-13 show a specific number of memory cells 902 and transistors 1106 and 1204 being formed, other, presumably larger, numbers of these transistors may be formed according to this process.

While embodiments have been described herein with reference to charge trapping memory, the invention is not limited to these examples. Instead, embodiments of the invention are applicable to other types of computer memory. The invention is useful for both charge-trapping and floating-gate devices. This invention may be implemented with multi-level cells or other multi-bit memory technologies.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of manufacturing a semiconductor device that includes a memory region, a first substrate region, and a second substrate region, comprising:

forming a first gate in the first substrate region;
forming a select gate in the memory region;
disposing a charge trapping dielectric in the memory region and the second substrate region;
disposing a gate layer in the memory region;
forming a memory gate on a sidewall of the select gate;
removing the charge trapping dielectric from the second substrate region; and
forming a second gate in the second substrate region;
wherein the memory gate is formed before the second gate is formed and the first gate is formed before the memory gate is formed.

2. The method of claim 1, further comprising disposing a hard mask on the first substrate region, wherein a thickness of the hard mask is thinner than a thickness of the first gate.

3. The method of claim 1, further comprising disposing a mask and a thick resist on the first substrate region.

4. The method of claim 1, further comprising disposing a lightly doped drain, adjacent to the first gate in the first substrate region through a hard mask.

5. The method of claim 1, further comprising removing a hard mask and simultaneously removing at least a portion of the second substrate region.

6. The method of claim 1, further comprising disposing a hard mask on the first substrate region, the second substrate region, and the memory region.

7. The method of claim 1, further comprising forming the gate length of the first gate at least twice as long as the gate length of the second gate.

8. The method of claim 1, further comprising removing the gate layer from a second sidewall of the select gate.

9. The method of claim 1, further comprising forming the second gate with the same gate thickness, but a different gate width, than the first gate.

10. The method of claim 1, further comprising forming the first substrate region as a high voltage substrate region and forming the second substrate region as a low voltage substrate region.

* * * * *